United States Patent [19]

Mori et al.

[11] Patent Number: 5,311,534

[45] Date of Patent: May 10, 1994

[54] SEMICONDUCTOR LASER DEVICES

[75] Inventors: Yoshihiro Mori; Nobuyuki Otsuka, both of Hirakata, Japan

[73] Assignee: Matsushita Electric Industrial Co., Ltd., Kadoma, Japan

[21] Appl. No.: 81,014

[22] Filed: Jun. 22, 1993

[30] Foreign Application Priority Data

Jun. 22, 1992 [JP] Japan .................. 4-162476

[51] Int. Cl.$^5$ ............................... H01S 3/19
[52] U.S. Cl. ........................... 372/46; 372/45
[58] Field of Search ..................... 372/46, 45

[56] References Cited

U.S. PATENT DOCUMENTS

| 4,841,536 | 6/1989 | Ohishi et al. | 372/46 |
| 5,093,278 | 3/1992 | Kamei | 372/46 |
| 5,181,219 | 1/1993 | Mori et al. | 372/45 |
| 5,214,662 | 5/1993 | Irikawa et al. | 372/46 |

Primary Examiner—Georgia Y. Epps

Attorney, Agent, or Firm—Ratner & Prestia

[57] ABSTRACT

A semiconductor laser device emits a stable and extremely high optical output. An etching-stop layer is formed at the interface between an active layer and a waveguide layer underlying the active layer, or in a waveguide layer, the layers above the etching-stop layer is processed in a stripe-shaped mesa. Subsequently, a current-blocking layer comprising thin layers of different conductivity type is formed above the etching-stop layer, the thickness of the etching-stop layer being so thin as not to distort the optical intensity distribution of laser light. Alternatively, an active layer and clad layers overlying and underlying the active layer is formed, and a current-blocking layer comprising thin layers of different composition which are alternatively stacked is formed. The conductivity type of the thin layers is reversed at least once during consecutive stacking, and the equivalent refractive index is larger than that of a semiconductor substrate and smaller than that of the mesa.

16 Claims, 7 Drawing Sheets

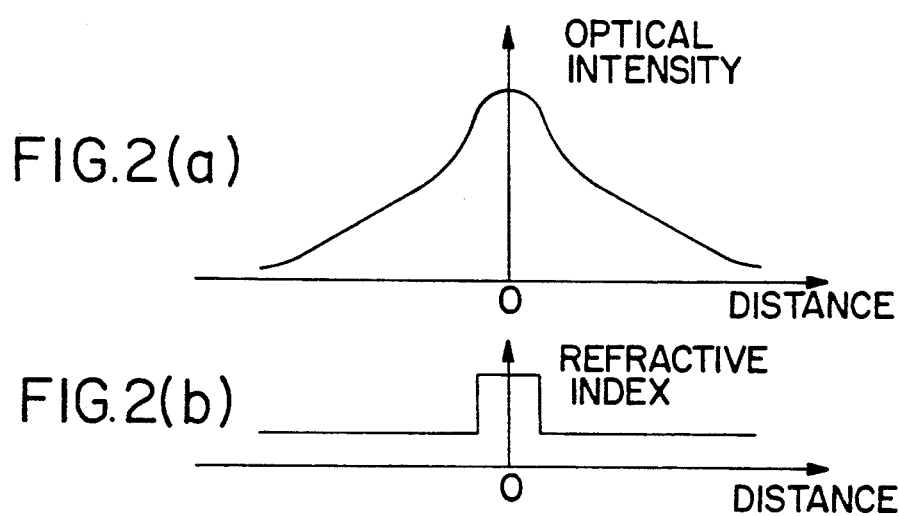
FIG.2(a)
FIG.2(b)
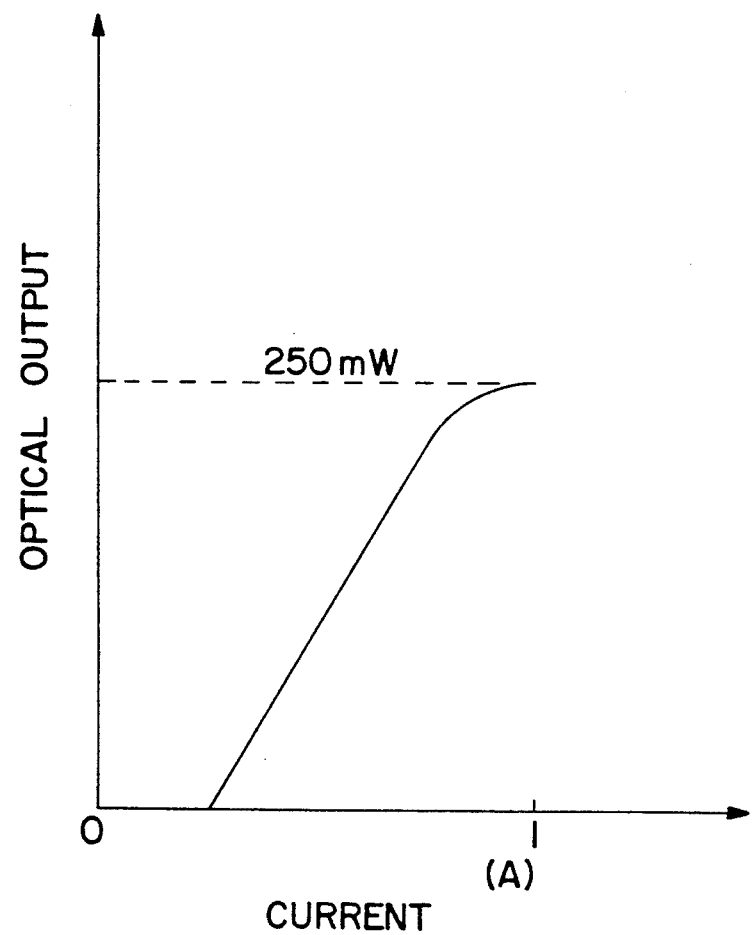
FIG.3

SEMICONDUCTOR LASER DEVICES

BACKGROUND OF THE INVENTION

The present invention relates to a semiconductor laser device used for optical communications and optical information processing, etc., in which analog or digital signals are transmitted via optical fiber cables. When transmitted a long distance, an optical signal will decay. For this reason it is desirable to amplify the signal on the way to the destined place.

An optical fiber amplifier was developed for that purpose, and may be able to amplify an optical signal by 1,000 times at a wavelength of 1.55 μm. The amplifier comprises an optical fiber of ca. 50 m in length, doped with erbium (hereafter referred to as erbium-doped optical fiber), and a semiconductor laser device with an optical output power of more than 150 mW at a wavelength of 1.48 μm or 0.98 μm (hereafter referred to as an excitation-use semiconductor laser device).

When a light from the excitation-use semiconductor laser device is applied to the erbium-doped optical fiber, electrons within erbium atoms are excited, and accumulate in excited states. An incidence of an optical signal upon the erbium-doped optical fiber gives rise to an stimulated emission of light, thereby resulting in an amplification of the optical signal. Therefore, the stronger the optical output of an excitation-use semiconductor laser device is, the more electrons are excited, thereby resulting in an enhanced amplification.

FIG. 1 shows a sectional view of a conventional excitation-use semiconductor laser device, and is described, for example, in Advanced Program of Optical Fiber Communications Conference 1992, page 45 which is incorporated herein by reference. In FIG. 1, 101 is an InGaAsP multiple-quantum-well (MQW) layer emitting a ray of laser light of 1.48 μm in wavelength. The MQW layer comprises three layers: The intermediate layer is an active layer emitting light, consisting of five strained InGaAsP well layers of 2.4 to 6.8 nm in thickness and InGaAsP barrier layers lying therebetween and of 1.2 μm in composition wavelength, where a composition wavelength is referred to as a wavelength of a light with an energy of the forbidden band of the relevant crystal. The remaining two layers are waveguide layers of 150 nm in thickness and 1.2 μm in composition wavelength. 102, 103, 104, and 105 are p-type InP clad layer, n-type InP clad layer, n-type current-blocking layer, and p-type InP current-blocking layer, respectively.

The refraction indexes of these layers are lower than that of the multiple-quantum well layer 101. The n-type InP clad layer 103 and the multiple-quantum-well layer 101 form a concave shape as shown in the figure. Hereafter, this shape is referred to as a mesa. The mesa is extended vertically to the plane of the paper in the shape of a stripe. Hereafter, the shape is referred to as a stripe.

The horizontal distribution of refractive index which laser light senses is shown in the lower figure of FIG. 2(b), where O in the horizontal axis represents the center of the active layer. The refractive index is large at the mesa. On the other hand, as shown in FIG. 2(a), the optical intensity distribution of laser light has a fundamental mode of single peak type being maximum at the center of the active layer. In this way, laser light travels along the MQW layer 101.

The current-blocking layers 104 and 105 are disposed in such a way so that they serve as a reverse biased p-n junction to prevent a leakage current 115, thereby evading current flow anywhere other than the MQW layer 101. Another leakage current 110 is observed which passes through a p-type InP current-blocking layer 105.

103 is a p-type InGaAs contact layer, and enables reducing contact resistance with a p-type electrode 107. 108 is an n-type InP substrate and 109 is an n-type electrode.

The light-emitting side of the device is coated by a low refractive film with a refraction index of 3%, while the opposite side is coated by a high refractive film with a refractive index of more than 80%, thereby enabling large yield of laser light at the light-emitting side. The length of a resonator is 900 μm.

FIG. 3 shows the characteristics of optical output versus current at a temperature of 25 degree centigrade, wherein an optical output of 250 mW is available at a current of 1 A.

As already mentioned, in order to enhance the amplification ratio of an optical fiber, it is necessary to increase the output of laser light of an excitation-use semiconductor laser device. However, the output of laser light goes to saturation due to its own thermal generation. Thus, it is desirable to make a structure that effectively liberates heat.

In order to make such a structure, the length of a resonator is extended so as to increase a contact area between the device and a heat sink. In the above mentioned example, an optical output of 310 mW is available with a resonator length of 1.5 mm.

However, an extended resonator results in a drop in outward differential quantum efficiency. Therefore, when the resonator is too long, an injection current is typically increased, so as to obtain a desired optical output, thus leading to an increase in heat generation, and eventually to a drop in optical output.

An alternative solution might be to increase the width of the MQW layer. This approach is based on the two reasons: one is that due to the broad path of a current, heat generation is constrained; the other is that due to the broad path of heat, efficiency of heat liberation is improved.

However, if the MQW layer 101 of FIG. 1 is extended, a difference in refractive index is too big, as shown in FIG. 4(b), and the transverse mode will shift to be multiple, that is, the optical intensity distribution exhibits a fundamental mode of double peak type. In this condition, the emitting light is split into two beams, thus making difficult a connection to an optical fiber.

The other problem is the reduction of the above described two kinds of leakage currents. Although the leakage currents are a small part of the total current, the total current amounts to as large as 1 ampere. Thus thermal generation by the leakage currents cannot be neglected. Furthermore, this temperature increase causes a drop in the standup, or forward voltage of the junction formed between the p-type InP current-blocking layer 105, and the n-type InP clad layer 103 and the n-type InP substrate 108, thus accelerating the increase of the leakage current 110.

Still furthermore, the increase of the leakage current 110 results in a gradual current increase through a thyristor structure formed by the p-type InP clad layer 102, the n-type InP current-blocking layer 105, and the p-type InP current-blocking layer 105, and the n-type InP clad layer 103 and the n-type InP substrate 108, thus further enhancing thermal generation.

SUMMARY OF THE INVENTION

In a first exemplary embodiment of the present invention, a clad layer is on and a waveguide layer is beneath an active layer. An etching-stop layer is either in the interface of the active layer and the waveguide layer or in the waveguide layer. The layers above the etching-stop layer are processed in the form of a stripe-shaped mesa. A current-blocking layer is also included wherein thin layers of different conductivity type are alternatively laminated outside of the mesa and above the etching-stop layer. The thickness of the etching-stop layer is thin so as to not distort the optical intensity distribution in the vertical direction of a laser light traveling in the waveguide layer. The refractive index of the waveguide layer is higher than those of an underlying semiconductor substrate and the current-blocking layer.

In a second exemplary embodiment of the present invention, there is a stripe-shaped mesa comprising an active layer and two clad layers holding it in, and a current-blocking layer outside of the mesa. The current-blocking layer is a multi-layer structure, wherein thin layers of different composition are alternatively stacked and the conductivity types of the layers are oppositely changed at least once.

The equivalent refractive index of the current-blocking layer is higher than those of the clad layers and the semiconductor substrate and is lower than that of the mesa, where the equivalent refractive index is referred to as an average refractive index a light senses when multiple layers are thin enough.

The common operation of both structures of the present invention is described below:

First, the structures can maintain a fundamental mode even under a high output operation, and obtain a much higher optical output than the conventional structures at a stable state. The reason is that the waveguide layer of the first structure and the current-blocking layer of the second structure are extended to a significant extent beside the mesa and are lower in refractive index than the clad layer thereon and the semiconductor substrate thereunder. Therefore, the difference in refractive index in the horizontal direction is lower than that shown in FIG. 4. Thus, even with the widened mesa, higher-order modes do not travel in the active layer because they vanish in a radiation mode, and only a fundamental mode does.

Second, a leakage current as shown as an arrow 110 in FIG. 1, can be reduced by more than one power of ten. The reason is that as thin layers constituting the current-blocking layer are thinner by more than one power of ten than in the conventional structures, the electrical resistances of the thin layers are higher by more than one power of ten than in the conventional structures. As for the first structure, the bandgap of the waveguide layer is narrower than that of the semiconductor substrate, thereby reducing a little bit the stand-up voltage against the leakage current compared to the conventional structures, and yet as a whole decreasing a leakage current by more than one power of ten due to the high resistance.

Third, the structures of the present invention can suppress a leakage current caused by a thyristor operation such as shown as an arrow 112 in FIG. 1, because a reduced leakage current such as shown by an arrow 110 in the same figure does not enable to give rise to a thyristor operation. In addition, as for the first structure, the current-blocking layer consists of a number of p-type and n-type thin layers, forming a somewhat thyristor structure, but a leakage current such as shown as an arrow 110 flows only through the thin layer just adjacent to the mesa, and therefore it never turns on the thyristor operation.

Next, the operation particular to the first structure is described below:

First, because the etching-stop layer is so thin a light does not sense the refractive index of the etching-stop layer and a single peak type is easily obtained. If the active layer and the waveguide layer are made of InGaAsP and the etching-stop layer is made of InP which is lower in refractive index than the former, and the thickness of the etching-stop layer is more than one fourth (about 100 nm) of the wavelength of a laser light in the device, then the vertical optical intensity distribution exhibits a double peak type having a maximum both in the active layer and in the waveguide layer.

Therefore, the thickness of the etching-stop layer is desirably less than one fourth, and more preferably one twentieth (about 20 nm) of the wavelength in terms of good stability and a single peak type optical intensity distribution.

Second, a horizontal difference in refractive index can be controlled by the thickness of the extended waveguide layer only. In other words, an optimum design can be obtained by adjusting the thickness of the waveguide layer even if the width of the mesa varies. Moreover, controlled parameters are only the width of the mesa and the thickness of the waveguide layer, thus resulting in stable mass production and high yield.

The operation particular to the second structure is described below:

First, as the composition of two kinds of thin layers that constitute the current-blocking layer are different, discontinuity occurs in the conduction band and the valance band at each junction plane between thin layers, thus serving efficiently to block a leakage current crossing the junction plane.

Second, an optimum confinement of light is enabled corresponding to the width of the mesa. For one example, an equivalent refractive index can be easily changed by varying the thickness ratios between adjacent layers. For another example, equivalent refractive index can be inclined towards the vertical direction by gradually changing thickness ratio.

If the thickness of a thin layer is over one fourth (about 100 nm) of the wavelength of a laser light within the device, a laser light senses a refractive index of each thin layer. Therefore, it is desirably less than one fourth, and preferably one tenth (about 40 nm). In the latter case, a light senses as if the current-blocking layer were a uniform or homogeneous layer.

BRIEF DESCRIPTION OF THE DRAWING

FIGS. 2(a) and 2(b) show a refractive index distribution and an optical intensity distribution, respectively, in the horizontal direction a laser light senses in the conventional semiconductor laser device.

FIG. 3 shows a characteristic of optical output against current of the conventional semiconductor laser device.

DETAILED DESCRIPTION OF THE INVENTION

Figure 5:
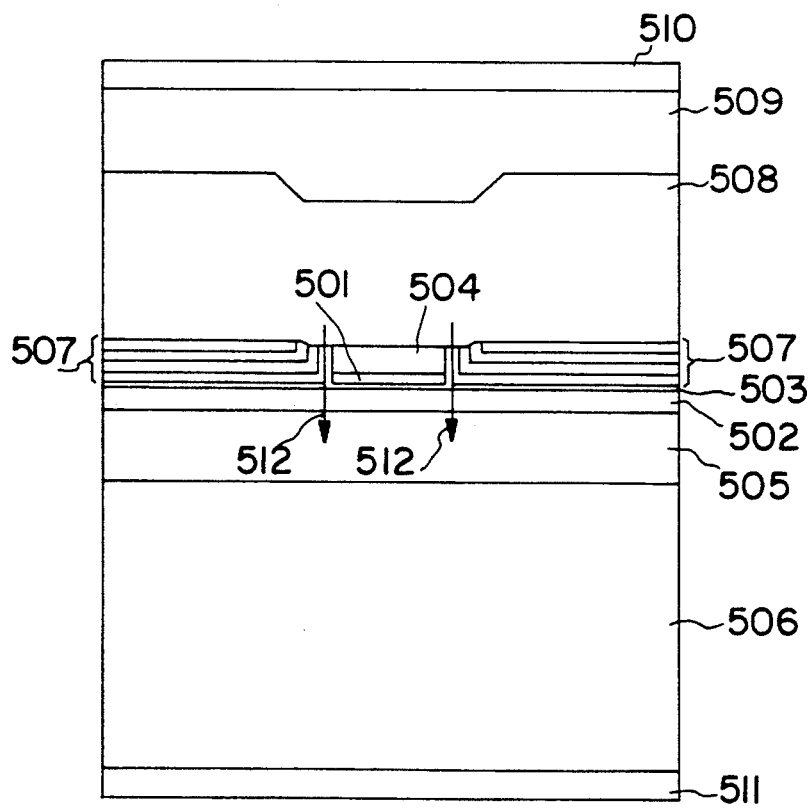
FIG. 5 is a sectional view of one embodiment of the first semiconductor laser structure of the present invention.

FIG. 5 is a sectional view, as is cut across by a plane perpendicular to the advancing direction of a laser light, of one exemplary embodiment of the first semiconductor laser structure of the present invention.

501 is an active layer including an InGaAsP MQW layer that emits a laser light of 1.48 $\mu$m in wavelength, consisting of five strained InGaAsP well layers of 3 nm in thickness each and InGaAsP barrier layers of 10 nm in thickness each, and of 1.2 $\mu$m in composition wavelength, lying therebetween. 502 is an n-type InGaAsP waveguide layer of 150 nm in thickness and of 1.2 $\mu$m in composition wavelength. 503 is an etching-stop layer of n-type InP and of 10 nm in thickness. 504 and 505 are a p-type InP clad layer of 0.2 $\mu$m in thickness and an n-type InP clad layer of 1 $\mu$m in thickness, respectively.

The layers from 501 to 505 are consecutively deposited by the organic metal vapor growth method on an n-type InP substrate 506.

Subsequently, after a SiO2 stripe of 7 $\mu$m in width serving as an etching mask if formed thereon, the p-type clad layer 504 is selectively etched by a mixture of hydrochloric acid and water. The active layer 501 is then selectively etched by a mixture of sulphic acid and hydrogen peroxide and water or a mixture of nitric acid and water. The first mixture selectively etches only InP and does not attack InGaAsP, and the second or the third mixture selectively etches only InGaAsP and does not attack InP.

The etching-stop layer 503 serves to suppress the etching reaction of the mixture of sulphic acid, hydrogen peroxide and water or the mixture of nitric acid and water, thereby preventing the erosion of the waveguide layer 502.

In this way, a mesa of 5 $\mu$m in width comprising the p-type InP clad layer 504 and the active layer 501 is formed.

Next, as the SiO2 stripe remains left, a current-blocking layer 507 is deposited by the organic metal vapor growth method, in such a way n-type, p-type, n-type and p-type InP thin layers of 70 nm each in thickness are consecutively deposited from the bottom to the top.

After the SiO2 stripe is removed, a p-type InP outward clad layer 508 of 3 $\mu$m in thickness and a p-type InGaAs contact layer 509 are formed again by the organic metal vapor growth method. The contact layer 509 serves to decrease a contact resistance with a p-type electrode 510.

Then, the bottom side of the n-type InP substrate is removed by polishing to a thickness of 120 $\mu$m, and an n-type electrode 511 is formed thereon, thus ending the wafer process.

The crystal is cleaved so as to get a resonator length of 0.9 mm, and a low reflective film of 3% reflective index and a high reflective film of more than 80% are coated on the emitting side and on its opposite side of the device, respectively, so that high yield of laser light is available from the emitting side.

At a final stage, a wafer is cut into several devices, and each is assembled on a heat sink.

Figure 6A:
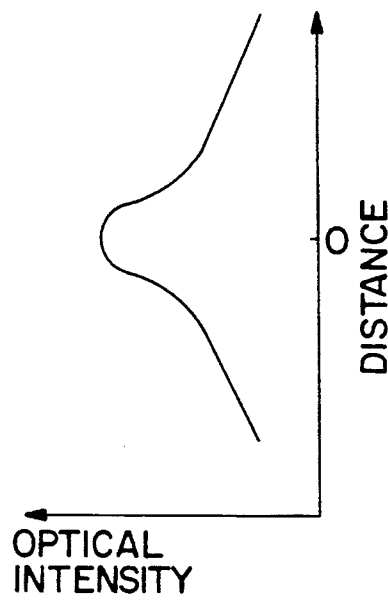
FIGS. 6(a) and 6(b) show a refractive index distribution and an optical intensity distribution, respectively, in the vertical direction at the center of the mesa in the device structure of FIG. 5.
Figure 6B:
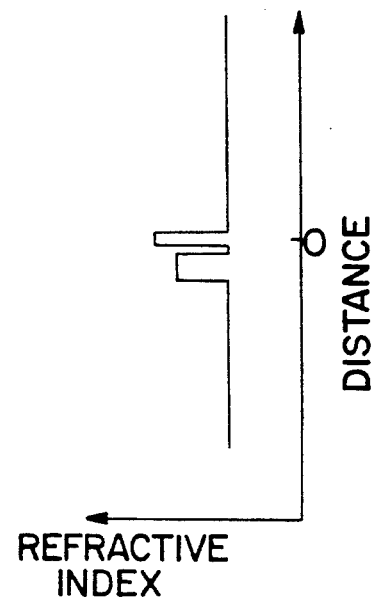

FIG. 6(b) shows a vertical distribution of refractive index, where O denotes the center of the active layer. If the thickness of the etching-stop layer is more than one fourth (about 100 nm) of the wavelength of a laser light in the device, the laser light senses the existence of the layer and the vertical distribution of optical intensity exhibits a double-peak having a maximum value both in the active layer and the waveguide layer that have high refractive indexes.

In this state, an emitting light is split into two beams in the vertical direction, and it is difficult to make a connection to an optical fiber. In this embodiment, the thickness of the etching-stop layer is 10 nm, or about one of the wavelength of a laser light in the device. Therefore, the laser light does not sense this layer, and a vertical distribution of optical intensity having a single peak as shown in FIG. 6(a) is obtained. In any case wherein the thickness of said layer is less than one twentieth (about 20 nm), an emitting light is stable, and single-peak type distribution of optical intensity is exhibited.

Figure 7A:
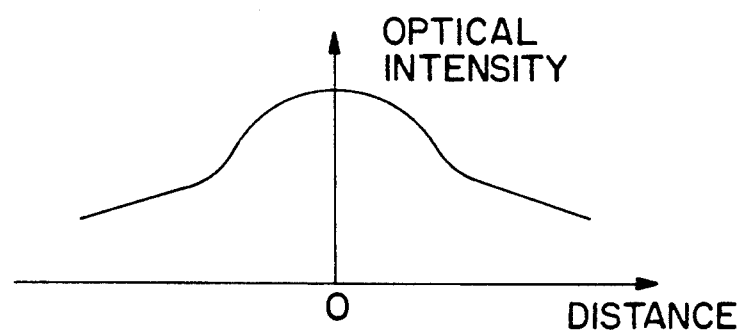
FIGS. 7(a) and 7(b) show a refractive index distribution and an optical intensity distribution, respectively, a laser light senses in the horizontal direction in the device structure of FIG. 5.
Figure 7B:
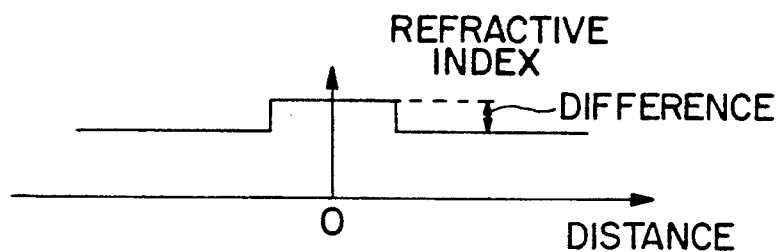

FIG. 7(b) shows a horizontal distribution of a refractive index, where O denotes the center of the active layer. It exhibits as high a refractive index at the mesa as in the conventional case shown in FIG. 4(b), and a higher refractive index outside of the mesa than that shown in FIG. 4(b). This is because the refractive index of the extended waveguide layer 502 is higher than those of the underlying and the overlying layers, and the layer beside of the mesa exhibits a somewhat similar distribution of optical intensity as shown in FIG. 6(a), giving a higher equivalent refractive index compared to genuine InP.

Figure 4A:
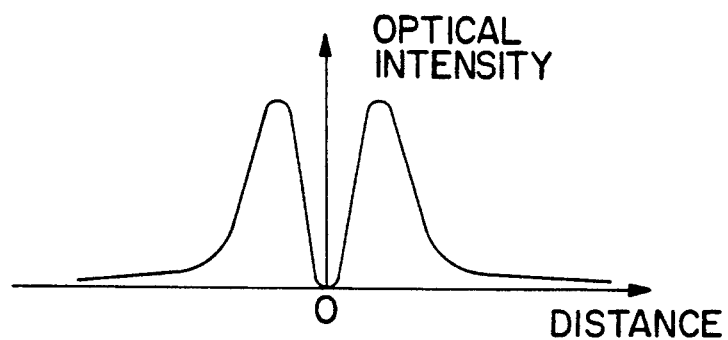
FIGS. 4(a) and 4(b) show a refractive index distribution and an optical intensity distribution, respectively, a laser light senses, in the case that the width of the mesa is widened in the conventional semiconductor laser device.
Figure 4B:
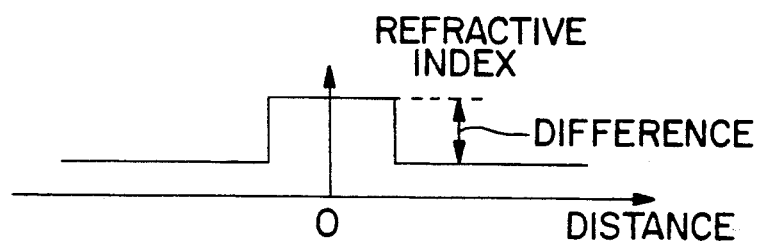

Therefore, a horizontal difference in refractive index is lower than that shown in FIG. 4(b), and even if the width of the mesa is extended, a higher-order mode becomes a radiation mode and does not propagate in the active layer. Only a fundamental mode having a single-peak type distribution of optical intensity can propagate.

In this way, under a high output operation a fundamental mode is maintained, and a stable and an extremely higher optical output than in the conventional case can be obtained.

If the width of an active layer can be 3 times larger than in the conventional case, heat generated by injection current is uniformly and widely distributed within the actual layer. Thus the temperature rise is small. In addition, as the thermal path to a heat sink next to the p-type electrode 510 become 3 times larger, thermal radiation efficiency can be outstandingly improved.

In short, comparing to the conventional case, because the double improvements of a small initial temperature rise and a good thermal radiation efficiency, the temperature rise of the active layer in this embodiment is very small. Furthermore, due to the following reason, a leakage current is outstandingly reduced, and thermal generation caused by said leakage current is almost negligible. The waveguide layer 502 is of 1.2 $\mu$m in composition wavelength, and of n-type InGaAsP which is narrower in bandgap than InP substrate of the conventional case, giving a smaller forward voltage drop against a leakage current.

However, as already described, the thickness of InP thin layers constituting the current-blocking layer 507 is 70 nm, smaller by more than one power of ten than in the conventional case. Also, the electric resistance of the thin layers is higher by more than one power of ten, giving by more than one power of ten smaller leakage current as indicated as an arrow 512.

Still furthermore, the current-blocking layer consists of two reverse-biased InP p-n junctions, and a somewhat thyristor structure having two gate layers, including the p-type InP outside clad layer 508, the current-blocking layer 507, and the waveguide layer 502 is formed. Because no current flows into the upper gate, and, as described above, a very small leakage current 512 flows into the lower gate, the thyristor is never turned on, contrary to the case of a thyristor current shown as an arrow 112 in FIG. 1.

Figure 8:
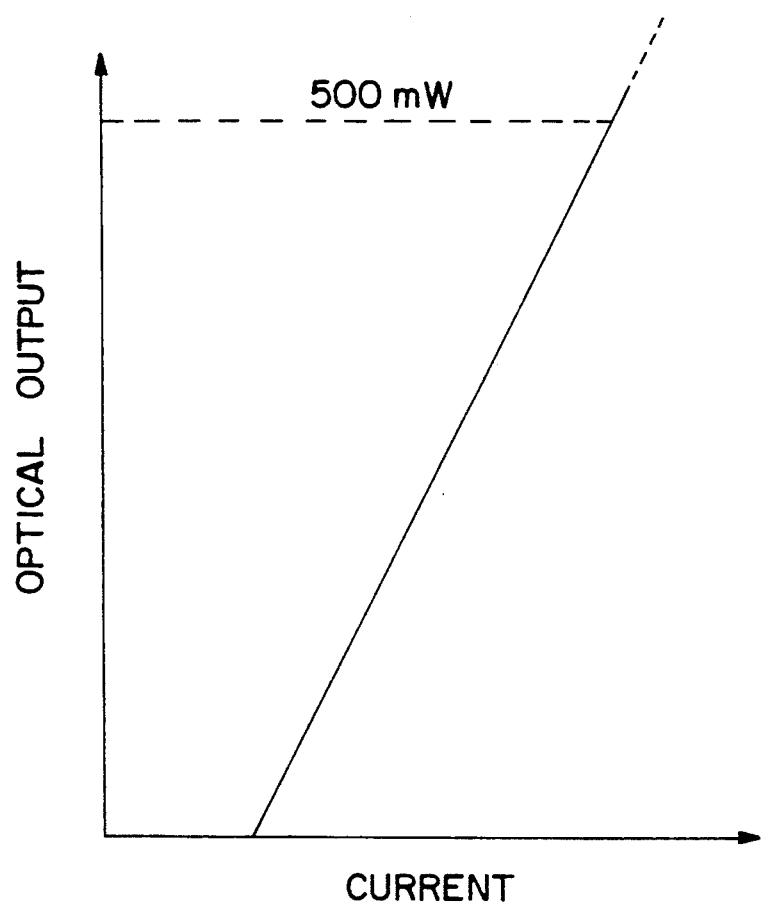
FIG. 8 shows a characteristic of optical output against current of the device structure of FIG. 5.

FIG. 8 shows a characteristic of optical output versus current of the embodiment where due to the above described reason, a saturation of optical output is hardly observed up to 500 mW, indicating that temperature rise in the active layer is well suppressed.

The difference in refractive index shown in FIG. 7(b) can be arbitrarily controlled by adjusting the ratio of the thickness of the active layer 501 over the thickness of the waveguide layer 502. In other words, even if the width of the mesa varies, an optimum design of optical intensity distribution can be obtained by only adjusting the thickness of the waveguide layers. A stable and high-yield mass production can be achieved by only monitoring the thickness of the waveguide layer.

Figure 9:
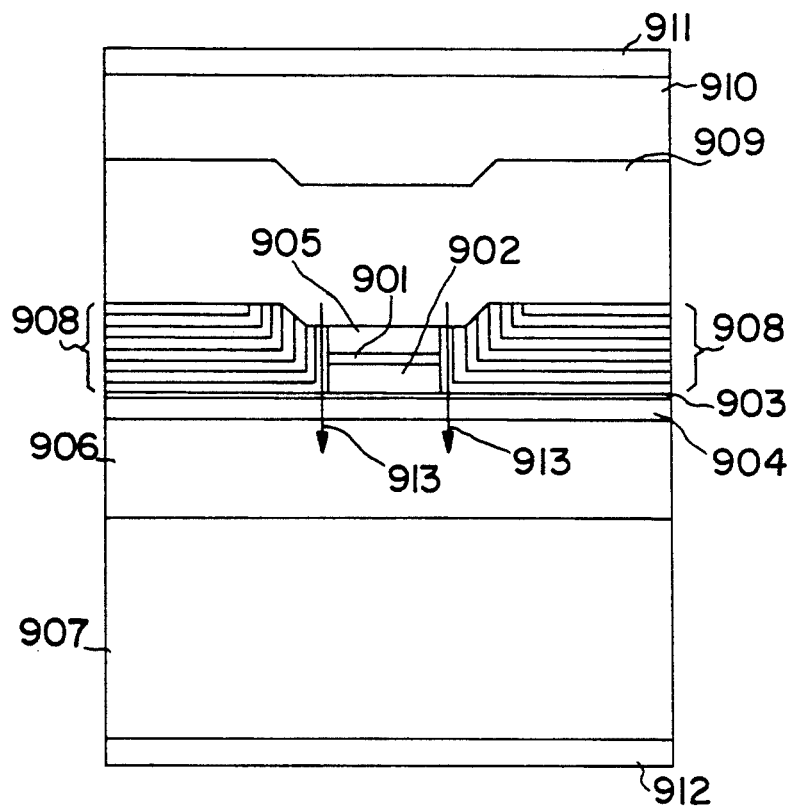
FIG. 9 is a sectional view of another embodiment of the first semiconductor laser structure of the present invention.

FIG. 9 is a sectional view, as is cut across by a plane perpendicular to the advancing direction of a laser light, of another embodiment of the first 15 semiconductor laser structure.

901 is an active layer including an InGaAsP MQW layer that emits a laser light of 1.48 $\mu$m in wavelength. The MQW layer consists of three strained InGaAsP well layers of 2.5 nm in thickness each, and InGaAsP barrier layers of 12 nm in thickness and of 1.2 $\mu$m in composition wavelength lying therebetween. 902 is the second waveguide layer of n-type InGaAsP, of 150 nm in thickness and of 1.2 $\mu$m in composition wavelength. 903 is an etching-stop layer of n-type InP and of 20 nm in thickness. 904 is the first waveguide layer of n-type InGaAsP, of 150 nm in thickness and of 1.2 $\mu$m in composition wavelength. 905 and 906 are a p-type InP clad layer of 0.2 $\mu$m in thickness and a n-type InP clad layer of 1 $\mu$m in thickness, respectively.

The layers from 901 to 906 are consecutively deposited by the organic metal vapor growth method on an n-type InP substrate 907. Subsequently, after a SiO2 stripe of 10 $\mu$m in width is formed thereon, the p-type InP clad layer 905 is selectively etched by a mixture of hydrochloric acid and water. The active layer 901 and the second waveguide layer 902 are then selectively etched by a mixture of sulphic acid, hydrogen peroxide and water, or a mixture of nitric acid and water. As described above, the first mixture etches off only InP and does not attack InGaAsP, and the second or the third mixture etches off only InGaAsP and does not attack InP.

The etching-stop layer 903 serves to suppress the etching reaction of the second or the third mixture, thereby preventing the erosion of the first waveguide layer 904. The thickness of the etching-stop layer 903 is tailored to be large compared to the case of the embodiment shown in FIG. 5, taking into account that because the etching rate of n-type InGaAsP of 1.2 $\mu$m in composition wavelength is slower than that of the active layer, it will take longer time to be completely removed.

Thus, as shown in FIG. 9, a mesa of 8 $\mu$m in width comprising the p-type InP clad layer 905, the active layer 901, the second waveguide layer 902 is easily formed.

Next, as the SiO2 stripe remains left, again by the organic metal vapor growth method, a current-blocking layer 905 is formed. The layer consists of 8 InGaAsP thin layers of 100 nm in thickness and of 1.1 $\mu$m in composition wavelength, which are deposited in the sequence p-type, n-type, p-type, n-type, and so on from the bottom to the top.

As InGaAsP has a higher refractive index than InP, a much smaller difference in refractive index compared to that shown in FIG. 7(b) of the first embodiment can easily be realized, thus effectively suppressing a higher-order mode. However, as the material is made from four elements, more adequate attention has to be paid to the fluctuation of composition during crystal growth than in the case of InP.

Next, after the SiO2 stripe is removed away, by the organic metal vapor growth method, a p-type InP outward clad layer 902 of 3 $\mu$m in thickness and a p-type InGaAs contact layer 901 of 1 $\mu$m in thickness are formed. The contact layer serves to decrease a contact resistance with a p-type electrode 911.

Then, the bottom side of the n-type InP substrate 907 is removed by polishing to a thickness of 120 $\mu$m, and an n-type electrode 912 is formed, thus ending the wafer process.

The crystal is cleaved so as to get a resonator length of 0.9 mm, and a low reflective film of 3% in reflective index and a high reflective film of more than 80% are coated on the emitting side and on its opposite side, respectively, so that high yield of laser light is attained from the emitting side.

At a final stage, after a wafer is cut into devices, each device is assembled on a heat sink.

Figure 10A:
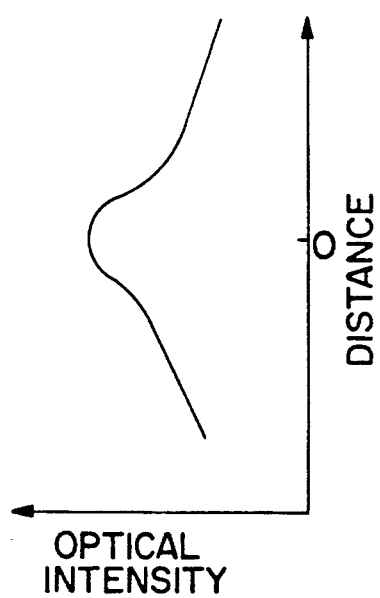
FIGS. 10(a) and 10(b) show a refractive index distribution and an optical intensity distribution, respectively, in the vertical direction at the center of the mesa in the device structure of FIG. 9.
Figure 10B:
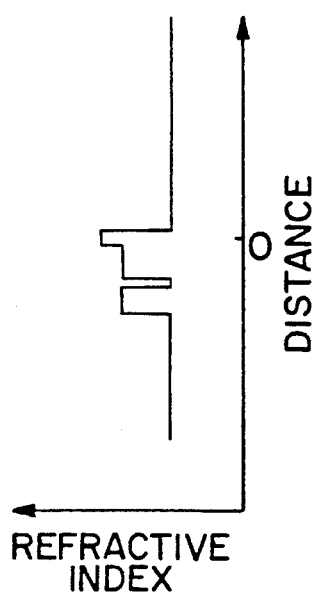

The right-side figure of FIG. 10 is a vertical distribution of refractive index at the center of the mesa where O denotes the center of the active layer. As described above, as the thickness of the etching-stop layer is 20 nm, about one twentieth of the wavelength of a laser light in the device, the laser light does not senses the existence of said layer, and thus a vertical distribution of optical intensity exhibits a single-peak type as shown in FIG. 6(a).

Horizontal distributions of refractive index and optical intensity that the laser light senses are the same as those shown in FIGS. 7(a) and 7(b). In this way, even under a high output operation a fundamental mode is maintained, and stable and more extremely higher optical output than in the conventional case can be obtained.

As is the case in the first embodiment, because the double improvements that an initial temperature rise is small and that thermal radiation efficiency is good, the temperature rise of the active layer in this embodiment is constrained very small.

Furthermore, due to the following reason, a leakage current is outstandingly reduced, and thermal generation caused by the leakage current is almost negligible.

The waveguide layer 902 is of 1.2 μm in composition wavelength, and of n-type InGaAsP and the current-blocking layer 908 is of 1.1 μm in composition wavelength and of n-type InGaAsP which is narrower in bandgap than InP substrate of the conventional case, giving a smaller forward voltage drop against a leakage current.

However, as already described, the thickness of InP thin layers constituting the current-blocking layer 908 is 100 nm, smaller by more than one power of ten than in the conventional case. Also, the electric resistance of the thin layers is higher by more than one power of ten, giving by more than one power of ten a smaller leakage current as indicated as an arrow 913.

Still furthermore, the current-blocking layer 908 consists of four reverse-biased InP p-n junctions, and a somewhat thyristor structure having four gate layers, including the p-type InP outside clad layer 909, the current-blocking layer 908 and the second waveguide layer 903 is formed. Because no current flows into the upper gates and, as described above, a very small leakage current 913 flows into the lowest gate, the thyristor is never turned on, contrary to the case of a thyristor current shown as an arrow 112 in FIG. 1.

A characteristic of optical output versus current of the embodiment is similar to that of FIG. 8, where a saturation of optical output is hardly observed up to 500 mW, indicating that temperature rise in the active layer is well suppressed.

The difference in refractive index in the horizontal direction can be arbitrarily controlled by either adjusting the ratio of the thickness of the active layer 901 over the thickness of the waveguide layer 902, or varying the composition of the current-blocking layer 908. Furthermore, a vertical distribution of optical intensity can be controlled by decreasing the refractive index of the second waveguide layer 904 against that of the first waveguide layer 902.

Figure 11:
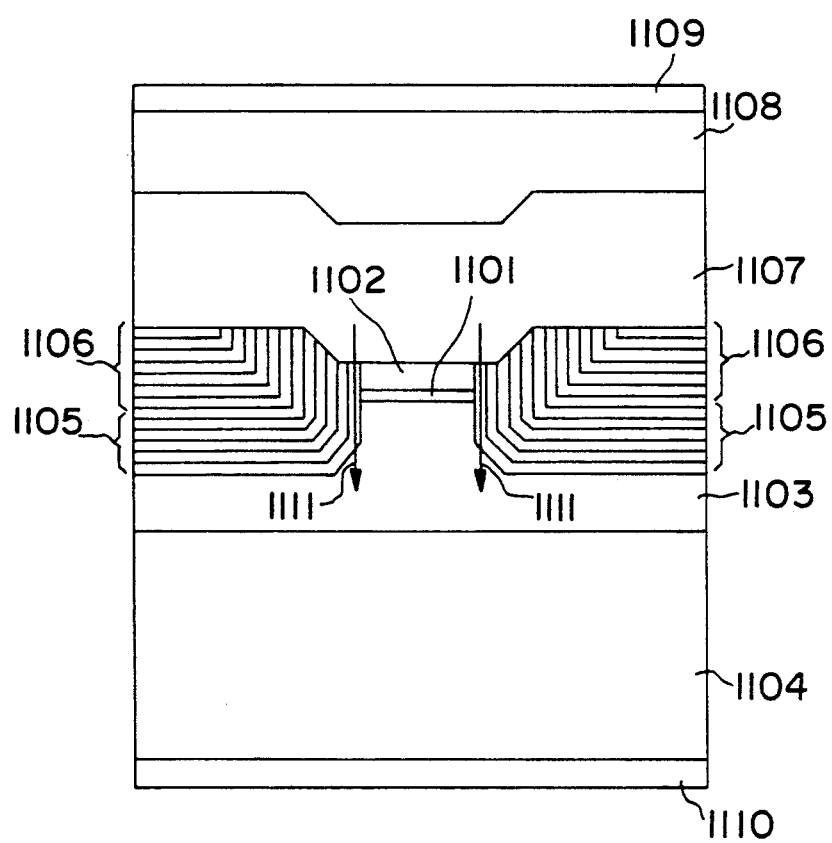
FIG. 11 is a sectional view of an embodiment of the second semiconductor laser structure of the present invention.

FIG. 11 is a sectional view, as is cut across by a plane perpendicular to the advancing direction of a laser light. 1101 is an active layer including a MQW layer that emits a laser light of 1.48 μm in wavelength, which consists of five strained InGaAsP well layer of 3 nm in thickness each and InGaAsP barrier layers of 10 nm in thickness and of 1.2 μm in composition wavelength lying therebetween. 1102 and 1103 are a p-type InP clad layer of 0.2 μm in thickness, and an n-type InP clad layer of 1 μm in thickness, respectively.

The layers from 1101 to 1103 are consecutively deposited by the organic metal vapor growth method on an n-type InP substrate 1104. Subsequently, a SiO2 stripe of 7 μm in width is formed thereon, and by etching, for example, by a mixture of acetic acid, hydrochloric acid and hydrogen peroxide, a mesa of 5 μm in width is formed as shown in FIG. 11.

As the SiO2 stripe remains, a p-type current-blocking layer 1105 and an n-type current-blocking layer 1106 are formed again by the organic metal vapor growth method, each layer consisting of n-type InGaAsP thin layers of 50 nm in thickness and of 1.2 μm in composition wavelength, and InP thin layers, which are alternatively laminated from the bottom.

After the SiO2 stripe is removed, a p-type InP clad layer 1107 of 3 μm thickness, and a p-type InGaAs contact layer 1108 of 1 μm in thickness are consecutively formed.

Then, the bottom side of the n-type InP substrate 1104 is removed by polishing to a thickness of 120 μm, and an n-type electrode 1110 is formed, thus ending the wafer process.

The crystal is cleaved so as to get a resonator length of 0.9 mm, and a low reflective film of 3% in reflective index and a high reflective film or more than 80% are coated on the emitting side and on its opposite side, respectively, so that high yield of laser light is attained from the emitting side.

At the final stage, after the wafer is cut into devices, each device is assembled on a heat sink.

A horizontal distribution of refractive index the laser light senses is the same as shown in the lower figure of FIG. 7. If each thin layer is thin enough, the refractive index of the current-blocking layer that the laser light senses is an average value of the thin layers. On the other hand, if the thickness of thin layers is more than one fourth (about 100 nm) of the wavelength of the laser light in the device, the laser light senses a refractive index of each thin layer. Thus it has to be kept below that value, preferably one tenth (about 40 nm).

Again in this embodiment, a difference in refractive index in the horizontal direction is smaller than in the case of FIG. 4(b). Thus, even if the width of the mesa is extended, a higher-order mode becomes a radiation mode and does not propagate in the active layer, while a fundamental mode having a single-peak type distribution of optical intensity similar to that shown in FIG. 7(a) can propagate in the active layer.

Therefore, even under a high output operation, a fundamental mode is maintained, and a stable and extremely high optical output can be obtained.

As the width of the active layer is three times larger than in the conventional case, in the same way as in the previous embodiments, thermal generation caused by injection current occurs uniformly and widely in the active layer, thus temperature rise is constrained very small. In addition, as the thermal conducting path to the heat sink next to the p-type electrode 1109 becomes more than three times larger in width, thermal radiation efficiency is outstandingly improved.

In short, comparing to the conventional case, because of the double improvements that an initial temperature rise is small and that thermal radiation efficiency is excellent, the temperature rise of the active layer in this embodiment is constrained very small.

As previously described, because of p-type current-blocking layer 1105 consists of two kinds of film layers of different composition which are alternatively stacked, there exists discontinuity at the junction planes in the conduction band and the valance band, hindering a current flow through the junction planes.

Figure 1:
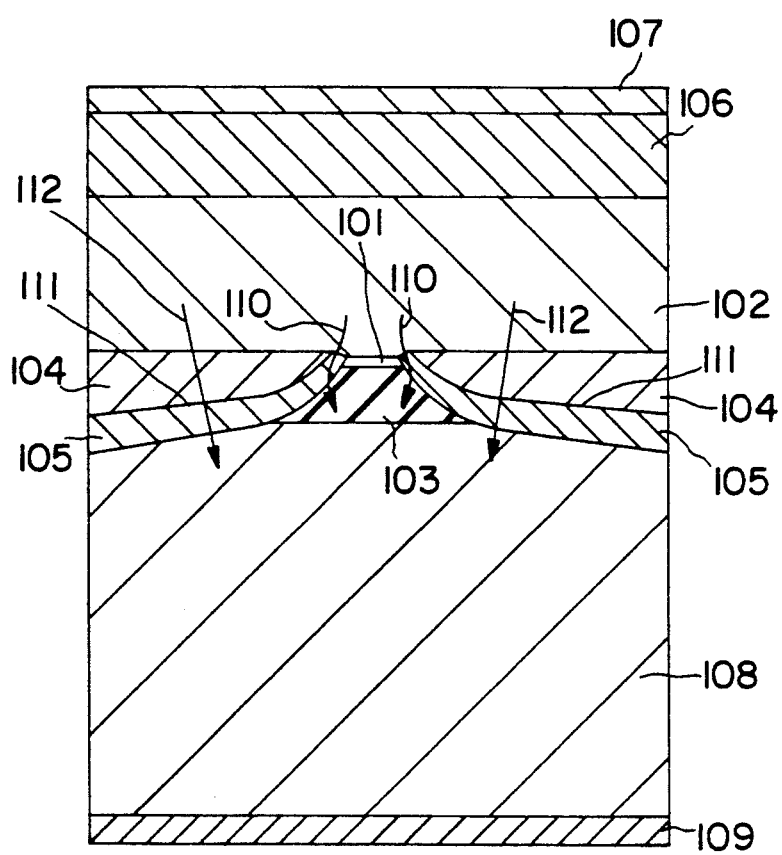
FIG. 1 shows a sectional view of the conventional semiconductor laser device.

Accordingly, a leakage current such as shown by an arrow 110 in FIG. 1 is limited to one shown as an arrow 1111 flowing through the n-type InGaAsP thin layer just beside of the mesa. As the thickness of the thin layers is 100 nm, by more than one power of ten smaller than in the conventional case, the electrical resistance becomes by more than one power of ten larger, or the leakage current denoted by an arrow 1111 can be by more than one power of ten reduced.

Because of a reduced leakage current 1111, a thyristor comprising the p-type InP outside clad layer 1107, the current-blocking layer 1105 and the n-type clad layer 1106 is never turned on, resulting in that such a thyristor current as shown as an arrow 112 of the conventional case is hardly observed.

In this embodiment, there are only one p-type and one n-type current-blocking layers. If there are more than two layers that are alternatively stacked, due to the same reason as explained about the first semiconductor laser structure, a thyristor current is completely null.

A characteristic of optical output versus current of this embodiment is similar to that shown in FIG. 8, and a saturation of optical output is hardly observed up to 500 mW, indicating that temperature rise in the active layer is well suppressed.

In this structure, an optimum confinement of light adapted for the width of the mesa can be possible by varying the thickness of each thin layer within the current-blocking layer. That is, when the width of the mesa is small, in order to enhance the confinement of light, a thinner InGaAsP layer and a thicker InP is useful for decreasing an equivalent refractive index, thereby increasing a difference in refractive index between the mesa portion and its neighboring portions.

Conversely, when the width of the mesa is extended, in order to lessen the confinement of light, a thicker InGaAsP layer and a thinner InP layer is useful for increasing a difference in refractive index, thereby decreasing a difference in refractive index between the mesa portion and its neighboring portions.

By gradually varying the thickness ration, an equivalent refractive index can be inclined, and an optimum confinement of light can be obtained depending upon the application.

The embodiments previously described are explained with the InGaAsP system of 1.48 μm n wavelength. However, the present invention is applicable for a laser device having well layers of a InGaAsP system of other than 1.48 μm, of a InGaAs system, of a AlGaAs system, of a AlGaInP system, or, furthermore, of semiconductor materials other than II-V elements.

The present invention is applicable even if an etching-stop layer outside of the mesa shown in FIG. 5 and FIG. 9 is diminished by etching.

The present invention is applicable even if the electrical polarity of each constituting layer is reversed.

The present invention is applicable for a laser device having an active layer consisting of a single layer instead of a MQW layer.

In addition, the application of the semiconductor laser device according to the present invention is not only for the amplification for optical fibers, but also for optical sources for optical communications, optical disks, laser printer, etc.

According to the present invention, semiconductor laser devices that emit a stable and extremely high output laser light compared to the conventional laser devices can be easily fabricated, wherein a fundamental mode is maintained even under high optical output operation, thermal generation caused by a leakage current is properly suppressed, and a desirable level of thermal radiation is obtained.

What is claimed is:

1. A semiconductor laser device, comprising;
    an etching-stop layer formed on the surface of a waveguide layer overlying a semiconductor substrate;
    a stripe-shaped mesa comprising an active layer and an overlying clad layer formed on the etching-stop layer; and
    a current-blocking layer comprising thin layers of different conductivity type which are alternatively stacked and is formed beside said mesa and over said etching-stop layer;
    wherein the etching-stop layer has a thickness which does not distort the vertical distribution of optical intensity of a propagating laser light; and the refractive index of said waveguide layer is larger than those of both said semiconductor substrate and said current-blocking layer.

2. A semiconductor layer device comprising:
    an etching-stop layer formed on a first waveguide layer overlying the surface of a semiconductor substrate;
    a stripe-shaped mesa comprising a second waveguide layer, an overlying active layer and a further overlying clad layer formed on the etching-stop layer;
    a current-blocking layer comprising thin layers of different conductivity type which are alternatively stacked formed beside said mesa and over said etching-stop layer;
    wherein the etching-stop layer has a thickness which does not distort the vertical distribution of optical intensity of a propagating laser light; and the refractive index of said waveguide layer is larger than those of both said semiconductor substrate and said current-blocking layer.

3. A semiconductor laser device according to claim 1, wherein the thickness of the etching-stop layer is less than one twentieth of the wavelength of a laser light within said device.

4. A semiconductor laser device according to claim 2, wherein the thickness of the etching-stop layer is less than one twentieth of the wavelength of a laser light within said device.

5. A semiconductor laser device according to claim 1, wherein the active layer comprises a single layer of InGaAsP or a quantum well structure having well layers of InGaA or InGaAsP; the waveguide layer is made from InGa$A_s$P whose bandgap is wider than that of the active layer; and the semiconductor substrate, the clad layer and the etching-stop layer are made from InP.

6. A semiconductor laser device according to claim 2, wherein the active layer comprises a single layer of InGaAsP or a quantum well structure having well layers of InGa$A_S$ or InGaAsP; the waveguide layer is made from InGa$A_s$P whose bandgap is wider than that of the active layer; and the semiconductor substrate, the clad layer and the etching-stop layer are made from InP.

7. A semiconductor laser device according to claim 5, wherein the thin layers within the current-blocking layer are made from InP.

8. A semiconductor laser device according to claim 6, wherein the thin layers within the current-blocking layer are made from InP.

9. A semiconductor laser device according to claim 5 wherein the thickness of the etching-stop layer is less than 20 nm.

10. A semiconductor laser device according to claim 6, wherein the thickness of the etching-stop layer is less than 20 nm.

11. A semiconductor laser device according to claim 7, wherein the thickness of the etching-stop layer is less than 20 nm.

12. A semiconductor laser device according to claim 8, wherein the thickness of the etching-stop layer is less than 20 nm.

13. A semiconductor laser device comprising:

a stripe-shaped mesa which comprises an active layer, a first overlying clad layer and a second underlying layer;

a current-blocking layer formed beside of said mesa, said current-blocking layer comprising a first and a second thin layer of different composition whose conductivity type is reversed at least once in a consecutive stack;

wherein said current-blocking layer has an equivalent refractive index larger than that of said clad layers and smaller than that of said mesa.

14. A semiconductor laser device according to claim 13 wherein the thicknesses of both the first thin layer and the second thin layer are less than one tenth of the wavelength of laser light in the device.

15. A semiconductor laser device according to claim 13 wherein said active layer comprises at least one of a single layer of InGaAsP and a quantum well structure having well layers of InGaAs or InGaA$_s$P, said first overlying clad layer is made from InP, and the first thin layer and the second thin layer are made from InP and InGaAsP, respectively.

16. A semiconductor laser device according to claim 15 wherein the thickness of both the first and the second layers are less than 40 nm.

* * * * *

UNITED STATES PATENT AND TRADEMARK OFFICE
CERTIFICATE OF CORRECTION

PATENT NO.   : 5,311,534
DATED        : May 10, 1994
INVENTOR(S)  : Mori et al.

It is certified that error appears in the above-identified patent and that said Letters Patent is hereby corrected as shown below:

Column 14, claim 16, line 16, "thickness" should be "thicknesses".

Signed and Sealed this

Fourth Day of April, 1995

BRUCE LEHMAN

Attest:

*Attesting Officer*

*Commissioner of Patents and Trademarks*